(12) United States Patent
Matroni et al.

(10) Patent No.: US 7,846,988 B2
(45) Date of Patent: *Dec. 7, 2010

(54) INK FOR PRINTING ON A GAME BALL

(75) Inventors: Gary Matroni, Agawam, MA (US); Thomas J. Kennedy, III, Wilbraham, MA (US); Michael J. Tzivanis, Chicopee, MA (US)

(73) Assignee: Callaway Golf Company, Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/829,092

(22) Filed: Jul. 1, 2010

(65) Prior Publication Data

US 2010/0265300 A1 Oct. 21, 2010

Related U.S. Application Data

(63) Continuation of application No. 12/546,482, filed on Aug. 24, 2009, now Pat. No. 7,750,061, which is a continuation of application No. 11/860,981, filed on Sep. 25, 2007, now Pat. No. 7,579,386.

(60) Provisional application No. 60/827,384, filed on Sep. 28, 2006.

(51) Int. Cl.
- C08F 2/46 (2006.01)
- C08F 20/18 (2006.01)
- C08F 220/20 (2006.01)
- G03F 7/031 (2006.01)
- C07C 49/786 (2006.01)
- C08G 59/14 (2006.01)
- C09D 11/10 (2006.01)
- B41F 31/00 (2006.01)

(52) U.S. Cl. .............. 522/100; 522/7; 522/8; 522/28; 522/38; 522/46; 522/182; 106/31.13; 101/491; 526/328.5

(58) Field of Classification Search .............. 522/100, 522/7, 8, 28, 38, 46, 182; 106/31.13; 101/491; 526/328.5

See application file for complete search history.

(56) References Cited

U.S. PATENT DOCUMENTS

| | | | | |
|---|---|---|---|---|
| 5,493,483 A | * | 2/1996 | Lake | 362/346 |
| 6,248,804 B1 | * | 6/2001 | Lutz | 523/160 |
| 7,579,386 B1 | * | 8/2009 | Matroni et al. | 522/100 |
| 7,750,061 B2 | * | 7/2010 | Matroni et al. | 522/100 |
| 2004/0132862 A1 | * | 7/2004 | Woudenberg | 523/160 |
| 2004/0142765 A1 | * | 7/2004 | Kennedy et al. | 473/351 |
| 2006/0055761 A1 | * | 3/2006 | Daems et al. | 347/105 |

* cited by examiner

*Primary Examiner*—Mark Eashoo
*Assistant Examiner*—Michael Pepitone
(74) *Attorney, Agent, or Firm*—Michael A. Catania

(57) ABSTRACT

An ink, method of inkjet printing the ink and game ball utilizing the ink are disclosed. The ink preferably comprises a diacrylate oligomer. The ink more preferably comprises an acrylate monomer in an amount ranging from 15 to 40 parts of a solid component of the ink, a diacrylate oligomer in an amount of 20 to 40 parts of a solid component of the ink, a pigment in an amount of 5 to 15 parts of a solid component, and a thinning agent.

6 Claims, No Drawings

INK FOR PRINTING ON A GAME BALL

CROSS REFERENCES TO RELATED APPLICATIONS

The Present application is a continuation application of U.S. patent application Ser. No. 12/546,482, filed on Aug. 24, 2009, now U.S. Pat. No. 7,750,061, which is a continuation application of U.S. patent application Ser. No. 11/860,981 filed on Sep. 25, 2007, now U.S. Pat. No. 7,579,386, which claims priority to U.S. Provisional Patent Application No. 60/827,384, filed on Sep. 28, 2006, now abandoned.

STATEMENT REGARDING FEDERALLY SPONSORED RESEARCH OR DEVELOPMENT

Not Applicable

BACKGROUND OF THE INVENTION

1. Field of the Invention

The present invention relates to an ink for printing on a game ball. More specifically, the present invention relates to an ink for dispensing from an inkjet printing machine onto a surface of a game ball.

2. Description of the Related Art

Inks that are used in ink jet printing commonly are water-based resins which contain dye as a coloring agent. Other types of inks, such as solvent-based (i.e., non-aqueous) formulations and ultraviolet ("UV") curable inks, could be useful in ink jet printing if an appropriate viscosity and surface tension of the ink could be achieved as to be compatible with both the ink jet printing system and the golf ball surface. UV curable inks are quick-curing inks and therefore are advantageous for use in continuous-type processes in which subsequent treatment of an ink-printed substrate is involved. A number of UV curable inks are known. For example, U.S. Pat. No. 4,271,258 discloses a photopolymerizable ink composition containing acrylate resin, methacrylate monomer or oligomer, acrylate monomer or oligomer, photoinitator, and a particular type of an epoxy resin. U.S. Pat. No. 5,391,685 discloses a UV curable ink having an isocyanate compound added thereto. U.S. Pat. No. 5,391,685 contends that the ink disclosed therein is particularly well suited for printing on slightly adhesive plastic bases, such as those made of polyoxymethylenes and polypropylenes.

Screen printing on spherical surfaces such as golf balls can be difficult. As a result, pad printing customarily is used for marking golf ball surfaces. However, many of the known UV curable inks are not well suited for pad printing due to difficulties in transferring the ink from a pad to a substrate. Furthermore, UV curable inks that can be pad printed have not been found suitable for use on golf balls. More specifically, when applied to a golf ball, these inks are not sufficiently durable (impact resistant) to withstand multiple blows by a golf club. It would be useful to obtain a highly durable UV curable ink which has favorable pad transfer properties when used for printing an indicia on a surface such as a curved and dimpled surface of a golf ball, and which provides an image having good durability.

Ink jet printing is commonly used to form multicolor images on paper for use in advertising materials, computer-generated photographs, etc. There are two fundamental types of ink jet printing: continuous and drop on demand. U.S. Pat. No. 5,623,001 describes the distinction between continuous and drop on demand ink jet printing. In continuous ink jet printing, a stream of ink drops is electrically charged and then deflected by an electrical field either directly or indirectly onto the substrate. In drop on demand ink jet printing, the ink supply is regulated by an actuator such as a piezoelectric actuator. The pressure produced by the actuation forces a droplet through a nozzle or nozzles onto the substrate.

It is known to print directly on a game ball surface using a continuous ink jet printer which relies on an electric charge to deliver droplets of ink to the game ball surface. (See JP 8322967-A, published Dec. 10, 1996 (Bridgestone) and JP 2128774-A, published May 17, 1990 (Bridgestone)).

Normally inkjet inks are composed of all monomers due to the need for a low viscosity such as 30 centipoise or less. However, monomers do not provide the necessary durability if the indicia is printed over the top surface of a game ball. The use of oligomers would give more durability, however, the viscosity of oligomers is in the thousands of centipoises.

BRIEF SUMMARY OF THE INVENTION

The present invention resolves the need for a more durable low viscosity ink jet ink by providing an ink with at least one oligomer and other components which reduce the viscosity. One of the components is a thinning agent, however, the amount of thinning agent cannot be too great.

The game ball surface may also be plasma treated to provide better adhesion.

Having briefly described the present invention, the above and further objects, features and advantages thereof will be recognized by those skilled in the pertinent art from the following detailed description of the invention.

DETAILED DESCRIPTION OF THE INVENTION

The ink of the present invention is ink-jet printed directly on a surface of a game ball using an ink jet printer. The invention also includes a method for ink-jet printing directly on a golf ball. An indicia is ink jet printed directly onto the top surface of the game ball. After the image has been applied, the ink is preferably cured with ultraviolet energy.

The ink of the invention can be used on curved surfaces of game balls such as golf balls, basketballs, baseballs, softballs, and the like, and is particularly useful on golf balls. It can be difficult to print on the curved and dimpled surface of a golf ball because the dimples tend to distort an image printed thereon and because the plastic cover of a golf ball, which typically is made of ionomer, balata, or polyurethane, has a low surface energy. The low surface energy of the ionomer cover makes adhesion difficult and also causes ink to form into beads when placed on the cover, thereby blurring the printed image. One way in which the present invention overcomes the beading problem is by applying the indicia on the top coat layer of the game ball, which requires that the indicia have good durability.

Inks contemplated to be suitable for ink jet printing typically have a viscosity of from about 1 to about 20 cps measured at the temperature of application. The ink is preferably a UV curable ink. To facilitate flow through the ink jet printer, a UV ink suitable for an ink jet printer should incorporate very finely divided pigments (about 0.1 micron or alternatively less than 100 Angstroms), dissolved dyes, or combinations of dyes and finely divided pigments. Flow additives, surface tension modifiers, extra solvent, etc. may be added to the ink formula to improve ink jet printability and prevent clogging of the ink jet printer.

The adhesion between the ink and the top coat and/or substrate is contemplated to be sufficiently strong so that the indicia remains substantially intact when the golf ball is used.

Standards for image retention vary depending upon the intended use of the golf ball and the degree and frequency of impact that the image is required to withstand. When applied to a golf ball, the desired ink durability is sufficient that after the golf ball is subjected to a wet barrel durability test procedure described below, at least about 50% of the surface area of the original image remains, optionally at least about 70%, optionally at least about 80%. Excellent durability results when more than about 85% of the image remains.

Although any ink jet printer may be used, two types of ink jet printers specifically contemplated for printing on golf balls are continuous ink jet printers and drop on demand ink jet printers. In a continuous ink jet printer, a stream of ink drops is electrically charged and then deflected by an electronic field either directly or indirectly onto the substrate. In a drop on demand ink jet printer, the ink supply is regulated by an actuator such as a piezoelectric actuator. The pressure produced by the actuation forces a droplet through a nozzle or nozzles onto the substrate.

The UV curable ink of the present invention can be used for printing indicia on golf balls, softballs, baseballs, other game balls, as well as other sporting good including, but not limited to, softball and baseball bats, tennis and racquetball rackets, and golf clubs. The ink also can be applied to a variety of materials including, but not limited to, ionomers, polybutadiene, composite materials, metals, etc.

As indicated above, the ink comprises a UV curable resin, a coloring agent, such as a pigment or a dye, one or more photoinitiators, and possibly a solvent. A thinning agent that includes a monomer and/or a solvent can be added. A wetting agent also can be included.

The coloring agent can be any type of pigment, dye or the like which will withstand UV treatment, i.e., which is not UV labile. Furthermore, the coloring agent is contemplated to permit sufficient passage of UV light through the ink, by any combination of transmission, reflection, or refraction mechanisms, to initiate photocrosslinking. Liquids or powders can be used. One non-limiting example of an ink is a powder which is dispersed in a liquid monomer. Carbon black and iron oxide black are non-limiting examples of suitable pigments for making black inks. Red lake and quinacrydones are non-limiting examples of suitable pigments for making red inks. Blends of different pigments and/or dyes can be used. The uncured ink can contain about 2-60 wt % colorant, alternatively about 5-30 wt % colorant, alternatively about 5-10 wt % colorant. The photoinitiator is selected to respond to the wavelength of UV radiation to be used for photoinitiation. It is also important to consider the color of the ink in selecting the photoinitiator because, as indicated above, it is necessary to the UV light to penetrate the ink composition to initiate the cure. More specifically, penetration is sometimes required in order to cure the portion of the ink which is beneath the surface. Penetration typically is most difficult when black or white pigments are used. Non-limiting examples of photoinitiators to be used in conjunction with black pigment include sulfur-type photoinitiators such as isopropyl thioxanthone, and benzophenone and its derivatives including acetophenone types and thioxanthones. Photoactivators can be used in conjunction with one or more photoinitiators. Non-limiting examples of suitable photoactivators are amine-type photoactivators such as ethyl 4-dimethylamino benzoate. The uncured ink may contain about 0.3-5 wt % photoinitiator, alternatively about 1-4 wt % photoinitiator, alternatively about 3-4 wt % photoinitiator. Blends of different photoinitiators, or photoinitiators and photoactivators can be used.

A thinning agent can be added to lower the viscosity of the uncured ink composition or to contribute to impact resistance or flexibility. When a monomer is used as a thinning agent, it optionally can be a photopolymerizable monomer that forms a polymeric structure upon irradiation. In contrast, when solvents are used as thinning agents, they evaporate during curing. The monomer can be a monofunctional, difunctional or multifunctional acrylate. Non-limiting examples of suitable monomers include 1,6 hexanediol diacrylate, butanediol diacrylate, trimethylol propane diacrylate, tripropylene glycol diacrylate and tetraethylene glycol diacrylate.

When a solvent is used in the UV curable ink, it typically is a liquid with a fast to moderate evaporation rate which, upon partial evaporation causes the ink to be tacky, and thereby promotes transfer onto and off an ink pad. A solvent also can be the medium in which a photoinitiator is dissolved.

The cured ink is contemplated to be sufficiently flexible to exhibit good impact resistance. It is advantageous for the top coat to react with the ink to hold the ink in place, or to have adhesion by hydrogen bonding and/or van der Waals forces. As a non-limiting example, the ink can be used in conjunction with a two-component polyurethane top coat, such as a top coat based on polyester or acrylic polyols and aliphatic isocyanates such as hexamethylene diisocyanate or isophorone diisocyanate trimers.

The conditions of UV exposure which are appropriate to cure the ink can be ascertained by one having ordinary skill in the art. For example, it has been found that when a golf ball passes through a UV treatment apparatus at a rate of about 10 ft./min. (about 3 m/min.) at a distance of about 1¼-1¾ inches (about 3.2-4.4 cm) from a UV light source which has an intensity of e.g. 200-300 watts/in$^2$ (31-47 watts/cm$^2$), (or alternatively 600 millijoules per square centimeter) the indicia may be exposed to UV radiation for no more than a few seconds, optionally no more than about 1 second, optionally no more than about 0.7 seconds. Higher and lower UV lamp intensities, distances, and exposure times may be used as long as the cured ink meets the applicable durability requirements. Excess UV exposure is avoided to prevent degradation of the substrate.

The ink of the invention provides for durability sufficient to meet stringent durability standards required for commercial grade golf balls. The durability of the ink can be determined by testing stamped golf balls in a variety of ways, including using the wet barrel durability test procedure.

Durability according to the wet barrel durability test procedure is determined by firing a golf ball at 135 ft/sec (at 72° F.) (41 m/s (at 22° C.)) into 5-sided steel pentagonal container, the walls of which are steel plates. The container has a 19½ inch (49.5 cm) long insert plate mounted therein, the central portion of which has horizontally extending square grooves on it which are intended to simulate a square grooved face of a golf club. The grooves have a width f 0.033 inch (0.084 cm), a depth of 0.100 inch (0.25 cm), and are spaced apart from one another by land areas having a width of 0.130 inches (0.330 cm). The five walls of the pentagonal container reach have a length of 14½ inches (36.8 cm). The inlet wall is vertical and the insert plate is mounted such that it inclines upward 30° relative to a horizontal plane away from opening in container. The ball travels 15½-15¾ inches (39.4-40 cm) horizontally from its point of entry into the container until it hits the square-grooved central portion of insert plate. The angle between the line of trajectory of the ball and the insert plate is 30°. The balls are subjected to 70 or more blows (firings) and are inspected at regular intervals for breakage i.e., any signs of cover cracking or delamination). If a microcrack forms in a ball, it speed will change and the operator is alerted. The operator then visually inspects the ball. If the microcrack cannot yet be observed, the ball is returned to the test until a crack can be visually detected. The balls are then examined for adhesion of the ink.

The following examples are included to further describe the invention.

TABLE ONE

|  | parts by wt. |
| --- | --- |
| Amine modified epoxy diacrylate oligomer[1] | 30.0 |
| Cyclic trimethyolpropane acrylate monomer[2] | 25.0 |
| Pentaerythritol triacrylate monomer[3] | 20.0 |
| Tetrahydrofurfuryl acrylate monomer[4] | 5.0 |
| Phosphine oxide and alpha hydroxyl ketone[5] | 7.0 |
| Black pigment in oligomer/monomer[6] | 10.0 |
| Trimethylbenzophenone and methylbenzophenone[7] | 2.0 |
| Defoamer[8] | 0.5 |
| Surface Additive[9] | 0.5 |
| Resin Solid Component Total | 100.00 |
| Methyl Acetate Ketone | 50.0 |

[1]Ebecryl 3703 (2650 cps @25° C.).
[2]SR531 (15 cps @25° C.).
[3]SR444 (520 cps @25° C.).
[4]SR285 (6 cps @25° C.).
[5]ESACURE KT046.
[6]Black Dispersion 9B1076 (30 cps @25° C.).
[7]ESACURE TZT.
[8]BYK-088.
[9]BYK-UV3500.

From the foregoing it is believed that those skilled in the pertinent art will recognize the meritorious advancement of this invention and will readily understand that while the present invention has been described in association with a preferred embodiment thereof, and other embodiments illustrated in the accompanying drawings, numerous changes, modifications and substitutions of equivalents may be made therein without departing from the spirit and scope of this invention which is intended to be unlimited by the foregoing except as may appear in the following appended claims. Therefore, the embodiments of the invention in which an exclusive property or privilege is claimed are defined in the following appended claims.

We claim as our invention:

1. A method for printing on a surface of a game ball, the method comprising:
    printing an indicia on a surface of a game ball using an inkjet printer, the indicia composed of an ink comprising
        a cyclic trimethylolpropane acrylate monomer in an amount ranging from 15 to 40 parts of a solid component of the ink;
        an amine modified epoxy diacrylate oligomer in an amount of 20 to 40 parts of the solid component of the ink;
        a pentaerythritol triacrylate monomer in an amount ranging from 10 to 30 parts of the solid component of the ink;
        a tetrahydrofurfuryl acrylate monomer in an amount ranging from 1 to 5 parts of the solid component of the ink;
        a pigment in an amount of 5 to 15 parts of the solid component;
        a first photoinitiator in an amount ranging from 5 to 15 of the solid component;
        a second photoinitiator in an amount ranging from 1 to 5 parts of the solid component; and
        a methyl ethyl ketone solvent in an amount ranging from 30 to 100 parts of the solid component.

2. The method according to claim 1 wherein the ink jet printer is a continuous ink jet printer.

3. The method according to claim 1 wherein the ink jet printer is a drop on demand ink jet.

4. An ink for inkjet printing on the surface of a game ball, the ink comprising:
    a cyclic trimethylolpropane acrylate monomer in an amount ranging from 15 to 40 parts of a solid component of the ink;
    an amine modified epoxy diacrylate oligomer in an amount of 20 to 40 parts of the solid component of the ink;
    a pentaerythritol triacrylate monomer in an amount ranging from 10 to 30 parts of the solid component of the ink;
    a tetrahydrofurfuryl acrylate monomer in an amount ranging from 1 to 5 parts of the solid component of the ink;
    a pigment in an amount of 5 to 15 parts of the solid component;
    a first photoinitiator in an amount ranging from 5 to 15 of the solid component;
    a second photoinitiator in an amount ranging from 1 to 5 parts of the solid component; and
    a methyl ethyl ketone solvent in an amount ranging from 30 to 100 parts of the solid component.

5. The ink according to claim 4 wherein the first photoinitiator is phosphine oxide and alpha hydroxyl ketone, and the second photoinitiator is trimethylbenzonphenone and methylbenzopheneone.

6. The ink according to claim 4 wherein the game ball is a golf ball.

* * * * *